(12) United States Patent
Grimm et al.

(10) Patent No.: US 11,729,536 B2
(45) Date of Patent: Aug. 15, 2023

(54) SENSING ELEMENT AND WIRELESS COMMUNICATION DEVICE FOR SINGLE-USE ELEMENTS

(71) Applicant: Sartorius Stedim Biotech GmbH, Göttingen (DE)

(72) Inventors: Christian Grimm, Heilbad Heiligenstadt (DE); Jochen Scholz, Göttingen (DE); Matthias Bode, Göttingen (DE); Andreas Prediger, Göttingen (DE); Patrick Courtney, Constance (DE)

(73) Assignee: Sartorius Stedim Biotech GmbH

( * ) Notice: Subject to any disclaimer, the term of this patent is extended or adjusted under 35 U.S.C. 154(b) by 68 days.

(21) Appl. No.: 16/967,338

(22) PCT Filed: Jan. 21, 2019

(86) PCT No.: PCT/EP2019/051308
§ 371 (c)(1),
(2) Date: Aug. 4, 2020

(87) PCT Pub. No.: WO2019/149547
PCT Pub. Date: Aug. 8, 2019

(65) Prior Publication Data
US 2021/0037297 A1 Feb. 4, 2021

(30) Foreign Application Priority Data
Feb. 5, 2018 (EP) .................................... 18000094

(51) Int. Cl.
*H04Q 9/00* (2006.01)
*H05K 1/02* (2006.01)
(52) U.S. Cl.
CPC ............. *H04Q 9/00* (2013.01); *H05K 1/0274* (2013.01); *H05K 2201/10106* (2013.01)

(58) Field of Classification Search
CPC .. H04Q 9/00; H04Q 2209/00; H04Q 2209/10; H04Q 2209/40; H04Q 2209/43;
(Continued)

(56) References Cited

U.S. PATENT DOCUMENTS 6,475,433 B2 * 11/2002 McGeorge .............. C02F 1/325
422/23
7,098,463 B2 * 8/2006 Adamovics ............... G01T 1/06
250/474.1
(Continued)

FOREIGN PATENT DOCUMENTS

| WO | WO 2006/099552 A2 | 9/2006 |
| WO | WO 2010/008874 A1 | 1/2010 |
| WO | WO 2010/106493 A1 | 9/2010 |
| WO | WO 2017/106068 A1 | 6/2017 |

OTHER PUBLICATIONS

International Search Report and Written Opinion, dated May 2, 2019, issued for International Application No. PCT/EP2019/051308, 8 pages.

*Primary Examiner* — Franklin D Balseca
(74) *Attorney, Agent, or Firm* — Klarquist Sparkman, LLP (57) ABSTRACT

Summarizing the invention, a sensing element for monitoring the state of a single-use sterilizable element such as a single-use bioreactor, wherein the state of the single-use sterilizable element is determined by at least one environmental condition is provided. The sensing element comprises: a variable component having at least one physical property that is configured to change in response to the at least one environmental condition and/or a change thereof, wherein the variable component comprises a sensing material with changing absorption characteristics for electromagnetic radiation configured to change in response to the at least one environmental condition and/or a change thereof.

7 Claims, 3 Drawing Sheets

(a)    (b)

(58) Field of Classification Search
CPC .......... H04Q 2209/47; H04Q 2209/50; H04Q 2209/80; H04Q 2209/84; H05K 1/0274; H05K 2201/10106; A61L 2/00; A61L 2/0005; A61L 2/0029; A61L 2/0035; A61L 2/0041; A61L 2/0047; A61L 2/0052; A61L 2/0058; A61L 2/0064; A61L 2/007; A61L 2/08; A61L 2/081; A61L 2/082; A61L 2/084; A61L 2/085; A61L 2/087; A61L 2/10; A61L 2/26; A61L 2/28; A61L 2202/00; A61L 2202/181; A61L 2202/182; A61L 2202/20; A61L 2202/21; A61L 2202/22; A61L 2202/23; A61L 2202/24; A61L 2202/26; C12M 23/28; C12M 37/00
See application file for complete search history.

(56) References Cited

U.S. PATENT DOCUMENTS

| | | | |
|---|---|---|---|
| 7,123,129 B1 | 10/2006 | Schrott et al. | |
| 8,963,684 B2 * | 2/2015 | Nyffeler | G11C 11/22 340/5.8 |
| 11,045,566 B2 * | 6/2021 | Leupold | C12M 23/28 |
| 2008/0024310 A1 | 1/2008 | Baker et al. | |
| 2010/0081208 A1 * | 4/2010 | Keite-Telgenbuscher | G01J 1/50 436/164 |

* cited by examiner

SENSING ELEMENT AND WIRELESS COMMUNICATION DEVICE FOR SINGLE-USE ELEMENTS

CROSS REFERENCE TO RELATED APPLICATIONS

This is the U.S. National Stage of International Application No. PCT/EP2019/051308, filed Jan. 21, 2019, which was published in English under PCT Article 21(2), which in turn claims the benefit of European Patent Application No. 18 000 094.5, filed Feb. 5, 2018. The prior applications are incorporated herein in their entirety.

TECHNICAL FIELD

The following description relates to a sensing element for monitoring the state of a single-use sterilizable element, as influenced by environmental conditions, and to a wireless communication device for transmitting information on the state of a single-use sterilizable element. Further the description relates to a single-use sterilizable element provided with the sensing element.

BACKGROUND

Sterilizable elements are used in several fields, such as biological, medical or pharmaceutical. These elements can undergo a sterilization process that removes microorganisms and other pathogens therefrom, without the sterilization process affecting their functionality. Some sterilizable elements are also single-use, in that they are meant to be used only once and then discarded.

Single-use sterilizable equipment commonly used in the biological and biotechnological fields includes for example bioreactors, bags, valves and tubing. These single-use elements are usually sterilized after production by means of ionizing radiation, such as gamma radiation or beta radiation, after being enclosed in a casing or packaging that preserves the sterilized state until use. Another method of sterilization is autoclaving, which subjects the element to be sterilized to elevated temperatures.

The requirements about sterilization as well as about conditions (e.g. temperature or humidity) in which the single-use element must be stored and/or transported may be essential for the subsequent safe use of the element. However, malfunctioning may occur during the sterilization process, so that e.g. the single-use element is not sterilized at all or only partially sterilized. Similarly, the subsequent handling of the single-use element may not comply with the necessary safety requirements because of a human mistake and/or a failure in a system configured to enforce such conditions (such as a refrigerating cell for maintaining low temperatures). Hence, there is a need for determining the state of an allegedly sterilized single-use element, particularly from outside its casing or packaging, in order to ascertain whether it has been properly sterilized and handled.

In particular, it is desirable to be able to determine the radiation dose to which the single-use element has been subjected. Currently, it is possible to perform only a qualitative assessment for irradiation of sterilizable single-use elements, namely a material that changes color if being gamma irradiated is used to ascertain whether the irradiation took place. However, as stated, such an indication is qualitative, in that it can merely be determined whether the component has been irradiated at all, but not the specific radiation dose. A quantitative assessment about the dosage is only possible using dosimeters, which are not available as a single-use component and are, thus, very costly if used for routine controls.

A common and inexpensive way of associating information to an item so that it can easily be read at a distance is to use radio-frequency identification (RFID) or near-field communication (NFC). Such techniques rely on electronic components that are affected by ionizing radiation or extreme temperatures, leading to temporary malfunctioning or permanent damage. It is therefore a problem to employ RFID or NFC techniques in combination with elements that undergo a sterilization process.

US 2008/0024310 A1 discloses a tracking system for gamma-radiation-sterilized bags and disposable items that uses RFID devices that are specifically manufactured to be gamma radiation resistant or encapsulated in a gamma-radiation-resistant enclosure. It may be, thus, expensive and/or cumbersome to ensure sterile conditions. Further, the information about the state of a disposable item must be written to the RFID device by a user.

SUMMARY

It is an object of the invention to provide a simple and reliable way to monitor and determine the state of a single-use sterilizable element, in particular whether it has been correctly sterilized.

The achievement of this object in accordance with the invention is set out in the independent claims. Further developments of the invention are the subject matter of the dependent claims.

According to one aspect, a sensing element for monitoring the state of a single-use sterilizable element such as a single-use bioreactor is provided, wherein the state of the single-use sterilizable element is determined by at least one environmental condition, the sensing element comprising: a variable component having at least one physical property that is configured to change in response to the at least one environmental condition and/or a change thereof, wherein the variable component comprises a sensing material with changing absorption characteristics for electromagnetic radiation configured to change in response to the at least one environmental condition and/or the change thereof.

A sensing element (hereinafter also referred to as "sensor") is an element that is capable of detecting specific conditions or features of the environment in which it is situated. The environment may be characterized by one or more environmental conditions, which may include but are not limited to physical properties of the environment that can be directly or indirectly measured (such as temperature, pressure and humidity) as well as processes occurring in the environment (such as sterilization and chemical processes). A process may be characterized by one or more factors contributing to it, wherein at least some of these factors may be quantifiable.

Usually physical properties may be measured at any time and may assume different values at different times or remain constant over time. Processes that take place in the environment may have a limited duration and may be repeated multiple times or occur only once. Physical properties of the environment and processes occurring in it may influence each other.

The sensing element is sensitive to the environmental condition in that it is affected by it. In particular, the sensing element may be affected in an "absolute" way, meaning that it is affected e.g. by a specific quantity of a physical property, by whether a process is taking place in the environment or not and/or by a specific factor of the process. Additionally or alternatively, the sensing element may be affected in a "relative" way, in the sense that it is sensitive to a change in the environmental condition. For example, the sensing element may be affected by a modification in a physical parameter (e.g. a variation in the temperature) and/or in a factor of the process (e.g. dose rate or exposure time of the radiation used for sterilization).

If there is a plurality of environmental conditions, the response of the sensing element to a given environmental condition may be characteristic for that specific environmental condition. In this way, the influence of different environmental conditions can be disentangled because they have different effects on the sensing element. In other words, there may be a one-to-one correspondence between environmental conditions and responses of the sensing element thereto. Alternatively, the sensing element may be insensitive to any environmental condition other than a target environmental condition that is of interest.

The effect of the environmental condition may be a change in the sensing element. In particular, the sensing element comprises a variable component having at least one physical property that changes in response to the environmental condition and/or a change thereof. The one or more physical properties may include but are not limited to absorption characteristics, color, elasticity, electrical impedance, luminescence, opacity and temperature. The environmental condition may affect the variable component directly, i.e. with a direct cause-effect relation between the environmental condition and the change in the physical property. Alternatively, the environmental condition may affect the variable component indirectly. For example, irradiation can lead to the generation of radicals in the surrounding gas atmosphere. These radicals can then change the properties of the sensing element, e.g. changing the fluorescent behavior of a sensing dye.

The change in the physical property may be reversible or irreversible. In the first case, the physical property of the variable element may be modified by the environmental condition and may subsequently be brought again to its original state. In the latter case, the variable element is affected such that its physical property is permanently changed. In particular, the change may be irreversible so that the effect of the environmental condition of interest on the variable element is securely recorded and it can be correctly determined that the single-use element was in a specific state at a given moment. For example, if an increase in temperature has occurred and the change of the physical property is irreversible, even if the temperature subsequently decreases, it can be correctly established that the single-use element was in a state of high temperature.

When the sensing element is sensitive to a change in the environmental condition, as explained above, the change in the physical property of the variable element corresponds to the change in the environmental condition. If the environmental condition involves a gradual change, the physical property of the variable element may also change gradually. In other words, the change of the physical property may take place by degrees, i.e. occur in different stages. If the environmental condition changes in discrete steps, the physical property may also change in a discrete manner. If the environmental condition changes in a continuous manner, the physical property may also change in a continuous manner or may change in a discrete manner. For example, sterilization by irradiation is a process in which the total amount of radiation to which the single-use element is exposed increases with time. The physical property of the variable element may gradually change with time as the amount of radiation increases. Therefore, it may be possible to monitor the state of the single-use element more accurately, in that the sensing element does not only react to the occurrence of a change in a binary way (i.e. monitoring whether a change did or did not take place) but can also provide more precise indications on the features of the change in qualitative and/or quantitative terms.

A single-use element is a disposable element, i.e. an element that is discarded after being used. The single-use element is configured for a one-time use and, after it has been used once, it has fulfilled its function and may be disposed of. A single-use sterilizable element is formed from sterilizable materials and helps reduce the risk of contaminations because of its disposability. Examples of single-use sterilizable elements include containers, bags, tubing assemblies, bioreactors, mixers and manifold assemblies.

Sterilization can be achieved using different methods including autoclaving, which involves high temperatures, and irradiation with beta rays or gamma rays, and single-use equipment is usually sterilized after production via one of these techniques. A state of sterilization of a single-use element is, thus, determined by the environment in which it is located, exemplarily by the presence of sterilizing radiation or by the elevated temperature of the environment.

More generally, a state of a single-use element indicates the particular condition of the element at a specific time, and is usually given by a combination of features pertaining to the single-use element. The features that are of interest to ensure proper and safe use of single-use sterilizable elements include sterilization and integrity, i.e. a condition of being free from damages or defects, which may be caused by improper handling of the single-use element such as exposure to unsuitable environments.

Monitoring the state of a single-use sterilizable element may include continuously detecting the environmental conditions to which the single-use sterilizable element is subjected. It may then be desirable to check the state of the single-use sterilizable element, i.e. determine whether the state of the element corresponds to a desired state or a state of interest at a given moment. A state of interest may be determined by one or more environmental conditions that occur at a different moment in time prior to the moment at which the state is checked.

A sensing element, as explained above, can detect environmental conditions and, consequently, can monitor the state of a single-use element as determined by said environmental conditions. To this aim, the sensing element must be coupled to the single-use element so as to be affected by the same environmental conditions determining the state of the single-use element. In one example, the sensing element may be in direct contact with the single-use element, such as attached or affixed to it. In another example, the sensing element may be indirectly connected to the single-use element.

The state of the single-use element can be determined by one or more environmental conditions. In the case of a plurality of environmental conditions, if only one (or a subset) of the environmental conditions is of interest, the physical property of the sensing element may respond to only one (or a subset) of the environmental conditions.

If the sensing element is to monitor the state of a single-use sterilizable element, it must be sterilizable as well, i.e. its correct functioning must not be compromised by the sterilization process. Sensors usually include electronic components that are damaged by sterilization methods. In particular, gamma rays and beta rays cause highly damaging ionization processes in the electronic components, especially in the semiconductors therein.

In accordance with the invention, a sterilizable sensing element comprises a sensing material with changing absorption characteristics for electromagnetic radiation as variable element. In other words, the physical property that is configured to change in response to the at least one environmental condition is the absorbance of the variable element for electromagnetic radiation. In the following the terms "sensing material" and "absorbing material" may be used interchangeably.

The sensing material with variable absorbance may be formed for example as a sheet, a bar or a parallelepiped; any form that enables the sensing material to be coupled to the single-use element (as explained above) and to have its absorbance measured is suitable for the variable component. Thus, the sensing material does not need to be formed in a particular fashion in order to function as a sensing element, since this function is inherent to the sensing material. Further, a piece of such sensing material does not contain any electronic components so it can be sterilized along with the single-use component without requiring shielding. Therefore it is easy and inexpensive to produce such a sensing element suitable for single-use sterilizable elements.

The sensing material may be a solid, a liquid or a gas and it may be comprise a single substance or a mixture of different substances. In the case of a liquid or gas, the sensing material may be enclosed in a receptacle e.g. made of plastics, and, thus, sterilizable. The receptacle would then determine the shape of the sensing material.

The absorbance of the sensing material is influenced by the one or more environmental conditions in that it is modified with respect to the absorbance of the sensing material before it is exposed to the environmental condition(s), e.g. to high temperatures or irradiation. The absorption of electromagnetic radiation may be measured for a given range of wavelength, such as the visible region, which includes waves having a wavelength from about 400 nm to about 700 nm. The change in the absorbance may be an increase or a decrease and it may be proportional to a modification of the environmental condition. For example, the absorbance variation may be a function of a radiation dose in case of sterilization by ionizing radiation. The change in the absorption characteristics may be measured by looking at the absorption spectrum and/or by directly measuring how much of the electromagnetic radiation is absorbed by the sensing material and how much is instead transmitted, as explained in more detail below.

According to a preferred embodiment, the sensing material has changing absorption characteristics for electromagnetic radiation in a first range of wavelength and it further has substantially fixed absorption characteristics for electromagnetic radiation in a second range of wavelength. In other words, the physical property of the variable element, i.e. the absorbance for electromagnetic radiation, is not affected by the environmental condition in the same way over the whole spectrum of electromagnetic radiation. Rather, the absorbance changes in response to the environmental condition only for a certain region of the electromagnetic spectrum, while remaining substantially constant in another region. "Substantially constant" means that, in the second range, the absorbance remains constant or varies by a very small amount in comparison to the change in the first region. For example, the change of the transmitted radiation intensity I in the first wavelength region may be greater by more than a factor of 10 than the change in the second wavelength region, i.e. they may differ by at least one order of magnitude. The relation between absorbance and radiation intensity is absorbance $A=-\log(I/I_0)$, wherein $I_0$ is the initial radiation intensity and I is the radiation intensity after the radiation passes through the sensing material.

The advantage of having a sensing material that exhibits a different behavior for different wavelengths is that it provides an internal reference value when actually checking the state of the single-use element, as explained in more detail below.

In a particularly preferred embodiment the sensing material is substantially non-absorbent in the second range of wavelength. In other words, the absorbance of the sensing material is negligible and it remains so without being affected by the environmental condition.

According to another preferred embodiment, the sensing material has first changing absorption characteristics for electromagnetic radiation in a first range of wavelength and second changing absorption characteristics for electromagnetic radiation in a second range of wavelength different from the first range of wavelength. For example, the absorbance of the sensing material may increase in the first range in response to the environmental condition and may decrease in the second range in response to the same environmental condition, or vice versa.

In accordance with another aspect of the invention, the variable component comprises at least one variable capacitor. In other words, the physical property that is configured to change in response to the at least one environmental condition is the capacitance. A capacitor is also suitable for sterilization, e.g. by irradiation or autoclaving.

The capacitance level in variable capacitors can be modified. In one example, the environmental condition (such as humidity or radiation for sterilization) may change a dielectric constant of a material interposed between the plates. Therefore the physical property that is modified, i.e. the capacitance, may change as a consequence of a change in the dielectric constant, on which it depends.

According to a preferred embodiment, if the at least one environmental condition is characterized by a quantity that can assume a plurality of different values, the variable component comprises a plurality of variable capacitors and each variable capacitor is configured to change its capacitance for a different value of the quantity.

Exemplarily, if the variable component is affected by a modification of the environmental condition, i.e. a variation in a physical property or in a process factor, each of the variable capacitors may be configured to change its capacitance for different stages of the modification. In other words, the response of the different variable capacitors may be elicited at different thresholds of a quantity characterizing the environmental condition. For example, a first variable capacitor may change its capacitance when the quantity has a first value, a second variable capacitor may change its capacitance when the quantity has a second value, and so on.

When the environmental condition is a physical property, this characterizing quantity may be the physical property itself, wherein the value is e.g. a number that describes the temperature on a temperature scale such as Celsius or Kelvin. When the environmental condition is a process, the characterizing quantity may be a factor of the process, e.g. a time-integrated radiation dose expressed in gray units.

Exemplarily, the plurality of different values may be seen as a series $x_1, x_2 \ldots x_n$ of increasing or decreasing values of the characterizing quantity. In this way, the sensing element may be able to more accurately monitor the state of a single-use element, because the change in the variable component can provide more precise information about the environmental condition to which the single-use element has been subjected. In particular, for a series of increasing values, if a variable capacitor that changes its capacitance when the quantity has a value $x_i$ has indeed changed its capacitance, it can be determined that the quantity characterizing the environmental condition has reached the value $x_i$. Further, if the variable capacitor associated with the value $x_{i+1}$ has not changed its capacitance, it can also be inferred that the quantity, after reaching the value $x_i$, did not further increase beyond the value $x_{i+1}$. Therefore it is possible to pinpoint a specific range for the quantity, e.g. it can be ascertained that the single-use element was exposed to a required temperature and, at the same time, that its environment did not exceed a certain damaging temperature.

In accordance with another aspect of the invention, the variable component comprises at least one variable resistor. In other words, the physical property that is configured to change in response to the at least one environmental condition is the resistance. One or more variable resistors may function analogously to the one or more variable capacitors described above, with the only difference that it is the resistance and not the capacitance that changes in response to the environmental condition.

Exemplarily, the variable resistors may be thermistors, whose resistance is strongly dependent on the temperature. Alternatively, the resistors may be sensitive to radiation. For example, in resistors made of $TiO_2$ the resistance decreases with increasing gamma radiation dose.

A sensing element may comprise a combination of the variable components heretofore described. Thus, a sensing element may comprise a sensing material with changing absorption characteristics and/or at least one variable capacitor and/or at least one variable resistor.

Another aspect of the present invention relates to a communication device comprising the sensing element according to any of the previous aspects, an electronic circuit configured to store electronic information and an antenna connected to the electronic circuit, wherein the antenna is configured to transmit a radio-frequency signal modulated by the electronic information, and wherein the electronic circuit is operatively coupled to the sensing element so that the at least one physical property affects the modulation of the radio-frequency signal.

The sensing element, as explained above, can provide information about the state of a single-use sterilizable element. Accordingly, there may be a need for retrieving such information from the sensing element in order to check the state of the single-use element, as mentioned above. A communication device comprises the sensing element and means for interpreting and wirelessly communicating the information provided by the variable component in the sensing element e.g. to a user. The means may comprise at least an electronic circuit configured to store electronic information and an antenna connected to the electronic circuit.

Exemplarily, the means may be a radio-frequency identification (RFID) device. In other words, the communication device may comprise the sensing element and the RFID device. An RFID device generally comprises an antenna for wirelessly transmitting and/or receiving radio-frequency signals and electronics operatively connected thereto, which could be analog and/or digital. The electronics may include, among others, an electronic circuit such as an integrated circuit (IC) or microchip, control logic and communications electronics. Passive RFID devices communicate in response to interrogation signals received from RFID readers and, thus, additionally include means for collecting power from the incident interrogation signal. Passive RFID devices can operate in a wide range of frequencies, between about 30 kHz and about 3 GHz, and have corresponding read ranges between about 30 cm and about 3 m.

The electronic circuit modulates and/or demodulates radio-frequency signals, i.e. it modifies one or more properties of a periodic waveform to transmit information. Usually the modulated signal is a mixture of two forms of modulation, amplitude modulation and phase modulation. Hence, the electronic circuit determines the information to be transmitted and the antenna is responsible for the actual transmission via a radio-frequency signal.

Therefore, in order to convey the information of the sensing element, the sensing element is operatively coupled to the electronic circuit. "Operatively coupled" is to be understood as coupled in such a way that the at least one physical property affects the modulation of the radio-frequency signal. The reason is that the at least one physical property of the variable component in the sensing element is the one configured to change in response to the environmental condition. Thus, the change in the physical property carries the information about the state of the single-use element as determined by the environmental condition. The coupling between the sensing element and the electronic circuit is such that the change in the physical property is reflected in the way the electronic circuit modulates the radio-frequency signal transmitted by the antenna. In other words, the change in physical property is translated into a change in the electrical characteristic of the communication device in response to a signal from an RFID reader.

As explained, electronic components such as the electronic circuit are sensitive to sterilization methods. Hence, while the sensing element is coupled to the single-use element at all times, the rest of the communication device (i.e. the electronic circuit and the antenna) is only operatively coupled to the sensing element (and, thus, indirectly to the single-use element) when a user wants to investigate the state of the single-use element. In other examples, the electronic circuit and antenna may be special gamma-radiation-resistant components. In these examples, the sensing element including the RFID circuit may be coupled to the single-use element at all times. In any case, the RFID reader is only operatively coupled to the sensing element (and, thus, remotely to the single-use element) when a user wants to investigate the state of the single-use element.

The specific coupling may depend on the specific sensing element and may require the inclusion of coupling means in the communication device.

In one example, if the variable component of the sensing element comprises a sensing material with changing absorption characteristics, the communication device may further comprise coupling means configured to operatively couple the electronic circuit to the sensing element, wherein: the coupling means comprise a LED, a first photodiode, wiring and electrical components, the LED and the first photodiode are disposed such that the sensing material is between the LED and the first photodiode, and the LED is configured to emit light towards the sensing material such that the light that is transmitted by the sensing material is incident on the first photodiode.

Exemplarily, the first photodiode may be connected via the wiring to the electronic circuit, optionally through some electrical components such as an inductor and a capacitor. The LED may also be connected to the electronic circuit, e.g. for providing a power supply to the LED. The LED and the first photodiode may be arranged on opposite sides of the sensing material, so that the light coming from the LED and transmitted by the sensing material can arrive at the photodiode. The LED may be a white LED, so that the emission spectrum may cover a broader range in comparison to monochromatic LEDs, such as between about 400 nm and about 700 nm. In particular, the emission spectrum of the LED may at least cover the wavelength range in which the absorption characteristics of the sensing material change in response to the environmental condition. The photodiode may be sensible to the same part of the electromagnetic spectrum in which the LED emits or at least to the wavelength range in which the sensing material changes its absorbance.

A photodiode converts incident light into an electrical current and the output current is a linear function of the incident light. Thus, the amount of current depends on the amount of light transmitted by the sensing material, which in turn depends on the absorbance of the sensing material. For example, the absorbance of the sensing material, as explained above, changes proportionally to the radiation dose, i.e. it provides a quantitative measure of the radiation dose used during sterilization. Therefore the power provided to the electronic circuit, which is in addition to the power provided by the interrogating signal, is a function of the radiation dose. The impedance of the electronic circuit depends on the power it receives and the modified impedance of the electronic circuit affects the modulated signal that is then transmitted by the antenna. This signal is read by the RFID reader and can, thus, provide information on the radiation dose to which the single-use element was subjected.

Further according to this example, when the sensing material has first and second absorption characteristics for a first and a second range of wavelength, respectively, the communication device may comprise a second photodiode and a comparator. The first photodiode is sensitive to the first range of wavelength and the second photodiode is sensitive to the second range of wavelength, the second photodiode is disposed such that the sensing material is between the LED and the second photodiode, the LED is configured to emit light towards the sensing material such that the light that is transmitted by the sensing material is incident on the second photodiode; and the comparator is configured to compare a first current generated by the first photodiode to a second current generated by the second photodiode in response to the incident light and to output a third current proportional to the difference between the first current and the second current.

The second photodiode may, as mentioned above, provide an internal reference for the change in the absorption characteristics in response to the environmental condition. Specifically, the amount of current produced by the first photodiode may not only depend on the amount of transmitted light, but also on the intensity of the light, namely the energy per unit area per unit time, which determines the number of photons hitting the photodiode. Accordingly, the modulated signal read by the RFID reader may not be exclusively due to a change in the absorption characteristics. In order to remove this ambiguity, the current produced by a second photodiode may be used as a comparison term. Since both photodiodes would be affected by a change in the light intensity, looking at one current signal in relation to the other removes the effect of the light intensity.

The first photodiode and the second photodiode may be positioned such that the transmitted light can reach both photodiodes. For example, they may be placed approximately next to each other horizontally or vertically or in any other direction.

The comparator may be a high-gain differential amplifier. The comparator has the first and second currents as input signals and the third current as output signal.

In another example, if the variable component of the sensing element comprises one or more variable capacitors and/or one or more variable resistors, the coupling means may comprise wiring connecting the electronic circuit to the variable capacitor(s) and/or variable resistor(s). In the following an example with one variable capacitor will be discussed, but the same principles apply for a plurality thereof and for variable resistors as well.

When the variable component is a variable capacitor, the coupling means may comprise wiring and electrical components to form a coupling circuit. For example, the variable capacitor may be connected via the wiring to a resistor and a conductor, as well as to the electronic circuit, so that the capacitor, the resistor and the conductor form an RLC circuit.

The change in the capacitance of the variable capacitor affects the impedance of the RLC circuit, the resonance frequency, the bandwidth or the Q-factor thereof. Since the RLC circuit is connected to the electronic circuit, these features of the RLC circuit contribute to the response of the communication device to an RFID reader.

In particular, the original impedance of the electronic circuit is modified by the coupling with the RLC circuit and this modification is dependent on the change in the capacitance of the variable element, which is determined by e.g. radiation dose. The modified impedance of the structure including the electronic circuit and the RLC circuit affects the modulated signal. According to one example, the modified impedance may change the interaction between the phase modulation and the amplitude modulation in the response signal of the communication device to the RFID reader. This signal is read by the RFID reader and can, thus, provide information on the radiation dose to which the single-use element was subjected.

As an alternative or additionally, a plurality of different RLC circuits may each be coupled to the electronic circuit to achieve a different modification, e.g. a different resonance frequency. In one example, one RLC circuit may be used to check the state of the single-use element (e.g. whether it was exposed to irradiation or a certain temperature) and another RLC circuit may be used to check the communication ability of the device (watchdog function).

According to a further example, the electronic circuit may store additional information about the single-use element for which it is used. Such additional information may comprise, but is not limited to, a single-use element ID, production details and use instructions.

Yet another aspect of the invention relates to a single-use sterilizable element comprising the sensing element according to any of the previous aspects.

A further aspect of the invention relates to a method for determining the state of a single-use sterilizable element according to the previous aspect, wherein the state of the single-use sterilizable element is determined by at least one environmental condition, the method comprising:

providing an electronic circuit that stores electronic information and an antenna connected to the electronic circuit that transmits a radio-frequency signal modulated by the electronic information;

operatively coupling an electronic circuit to the sensing element so that the at least one physical property affects the modulation of the radio-frequency signal;

sending an interrogating signal to the antenna to prompt the antenna to transmit the affected modulated radio-frequency signal.

BRIEF DESCRIPTION OF THE DRAWINGS

Details of exemplary embodiments are set forth below with reference to the exemplary drawings. Other features will be apparent from the description, the drawings, and from the claims. It should be understood, however, that even though embodiments are separately described, single features of different embodiments may be combined to further embodiments.

DETAILED DESCRIPTION

In the following, a detailed description of examples will be given with reference to the drawings. It should be understood that various modifications to the examples may be made. Unless explicitly indicated otherwise, elements of one example may be combined and used in other examples to form new examples.

Figure 1:
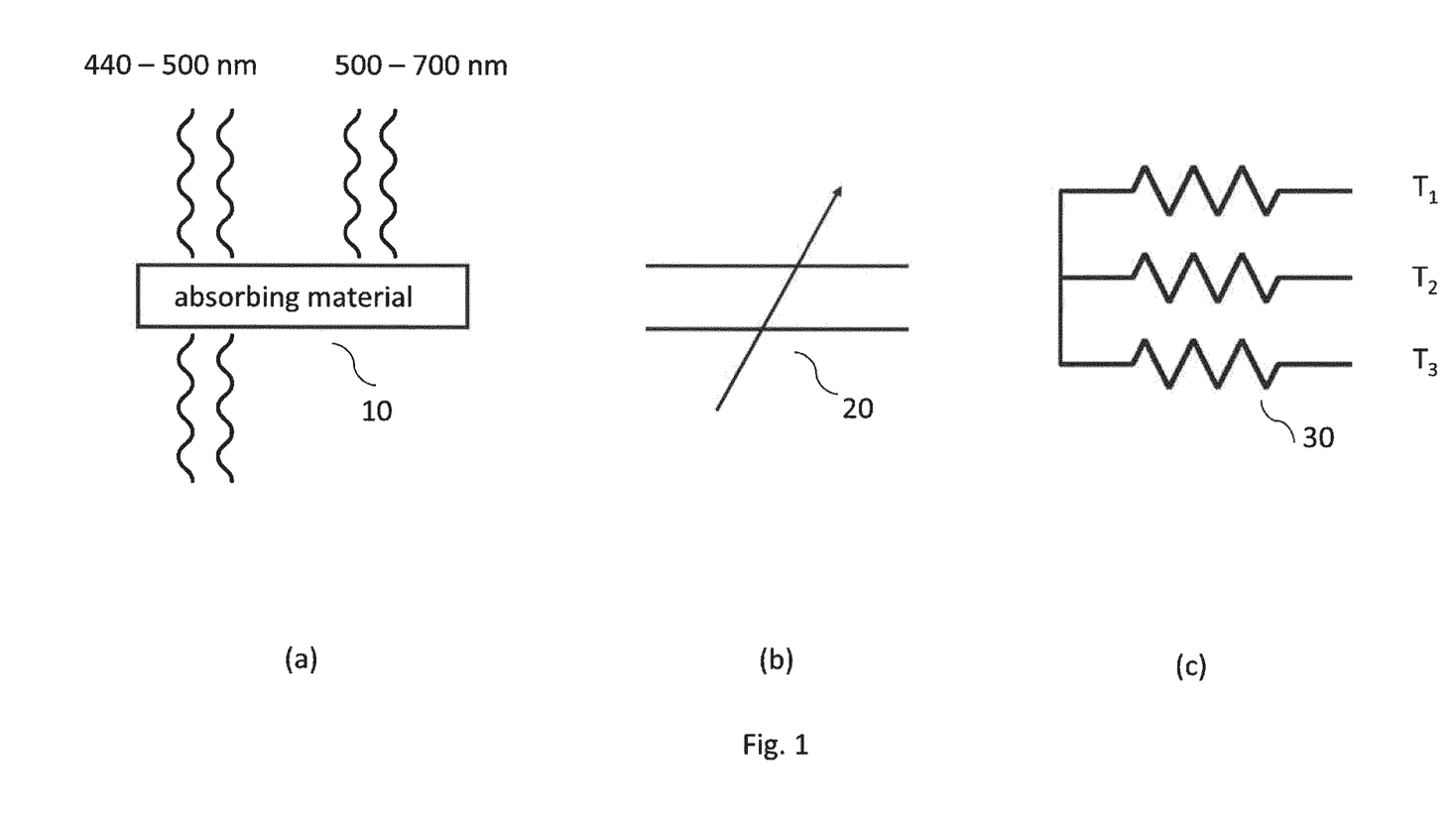
FIG. 1 shows different examples of a variable component for a sensing element.
Figure 3:
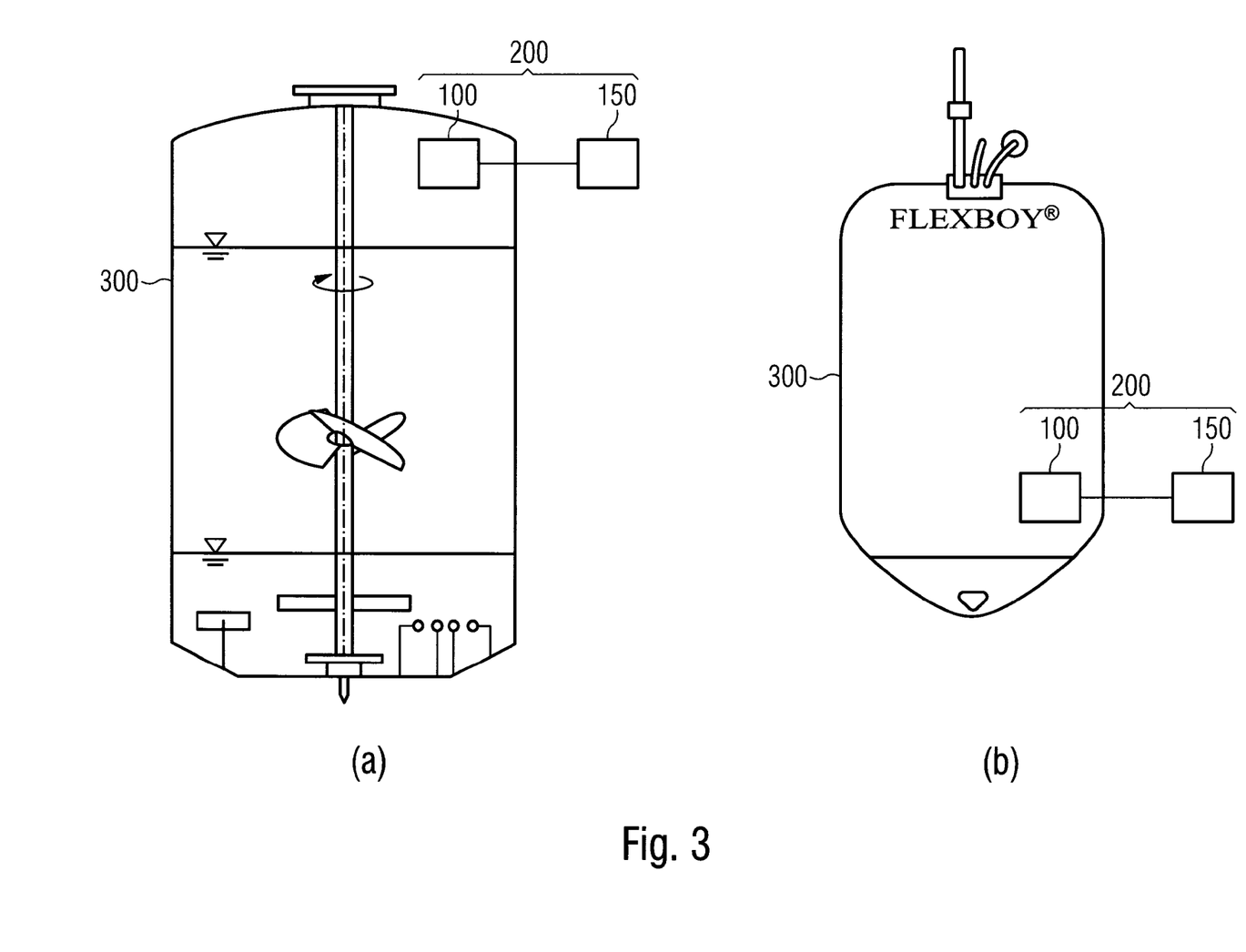
FIG. 3 shows two examples a single-use sterilizable element comprising a sensing element to which an RFID device is connected.

FIG. 1 shows different examples of a variable component for a sensing element 100 (as shown in FIG. 3) configured to monitor the state of a single-use sterilizable element 300 (as shown in FIG. 3). Each of these variable components has at least one physical property that is configured to change in response to an environmental condition and/or a change thereof, such as a sterilization process performed by irradiation or autoclaving, or such as a storage temperature.

The variable component may be an absorbing sensing material 10 with changing absorption characteristics for electromagnetic radiation. One example of such an absorbing material 10 is erioglaucine, also called Brilliant Blue FCF, which is an organic compound in the form of a powder soluble in water. Erioglaucinge absorbs light in the range of approximately 500 nm-700 nm with a maximum at about 620 nm, whereas the absorption in the range below 500 nm and down to approximately is negligible. Irradiation with gamma rays leads to a dose dependent drop of the absorbance in the range 500 nm-700 nm while the non-absorption in the range below 500 nm remains constant.

Therefore, if the single-use element 300 is sterilized with gamma radiation, the sensing element 100 comprising a variable component made of erioglaucine undergoes a modification of the absorbance in the range 500 nm-700 nm. Based on the properties of the material 10, i.e. on the correspondence between absorbance value and dose of gamma radiation, it is possible to determine whether the single-use element 300 was properly sterilized with the required radiation dose by measuring the absorbance of the absorbing material 10. In particular, since erioglaucine has a changing absorbance in a first range of wavelength (500 nm≤λ≤700 nm) and a fixed absorbance (which is substantially negligible) in a second range of wavelength (440 nm≤λ<500 nm), erioglaucine may provide an internal reference value when the absorbance is measured via a photodiode, as explained below.

The variable component may be a variable capacitor 20. The variable capacitor 20 may comprise two plates and a material interposed between the plates. The environmental condition, such as radiation for sterilization, changes the dielectric constant. In some examples, such as for MOS capacitors, the variation of the dielectric constant with the gamma radiation dose may be linear over a wide range of doses. The capacitance of the variable capacitor 20 changes as a consequence of a change in the dielectric constant.

The variable component may be a parallel connected manifold of temperature sensitive resistors 30, such as thermistors, with different temperature thresholds. Each thermistor changes its resistance when the temperature goes above a specific temperature threshold. Thus, each time the environmental temperature exceeds the threshold of one the resistors, the overall resistance value changes and it can be detected. Accordingly, the resistance value of the parallel connected manifold 30 provides quantitative information on the temperature to which the single-use element 300 has been exposed.

Figure 2:
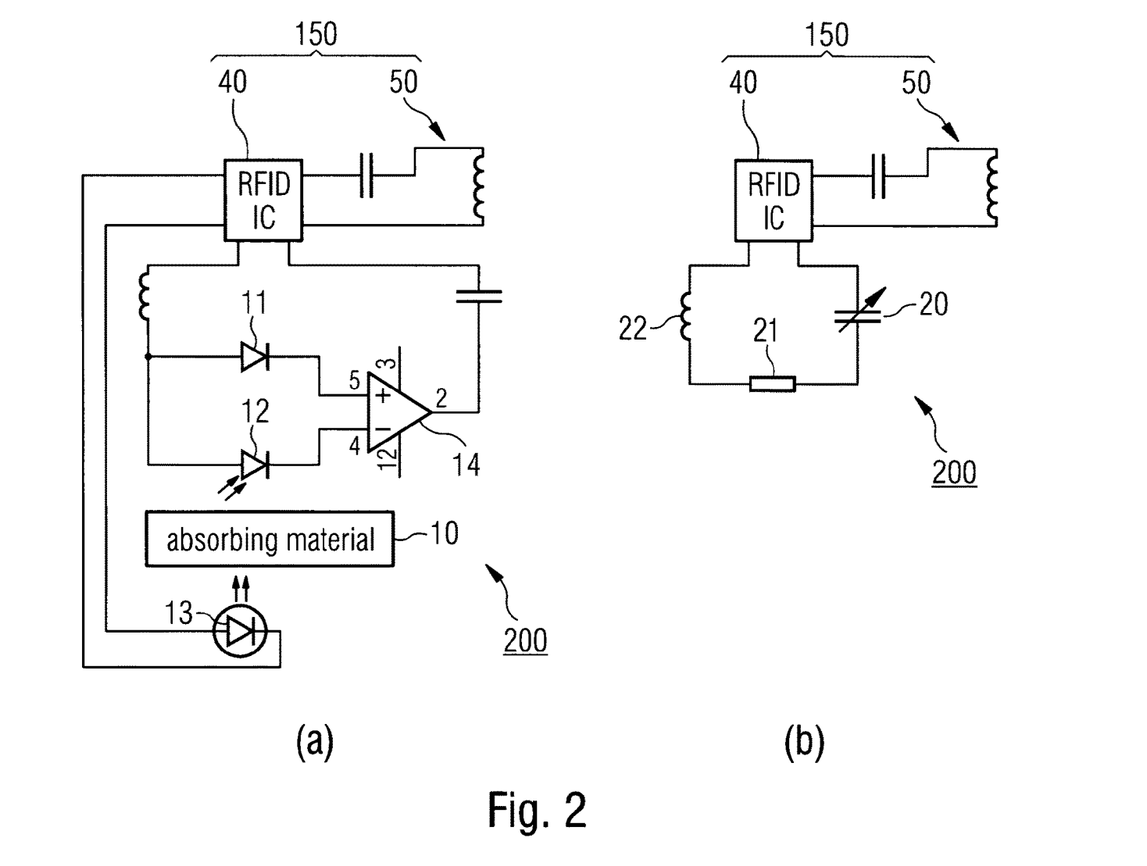
FIG. 2 shows different examples of a communication device including a sensing element and an RFID device.

FIG. 2 shows different examples of a communication device 200 including a sensing element 100 and an RFID device 150.

FIG. 2(a) shows a communication device 200 in which the sensing element 100 comprises an absorbing material 10 with changing absorption characteristics for electromagnetic radiation. The communication device 200 may comprise the RFID device 150, which includes an RFID IC 40 and an antenna 50, and coupling means for operationally coupling the RFID IC 40 with the absorbing material 10. The coupling means may comprise a LED 13, two photodiodes 11 and 12, a comparator 14 and/or wiring plus electrical elements to connect the different components to each other.

The LED 13 may be a white LED, so that the emission spectrum is between about 400 nm and about 700 nm. The LED 13 emits light in the direction of the absorbing material 10, such as erioglaucine. Erioglaucine substantially does not absorb the light in the range below 500 nm and absorbs light in the range 500-700 nm, depending on the amount of gamma radiation to which it has been subjected. The reflectance of the sensing element 100 comprising the absorbing material 10 may be minimized so that substantially all the light that is not absorbed by the absorbing material 10 is transmitted. Therefore, the amount of transmitted light depends on the absorbance of the material 10: in the range below 500 nm substantially all the light incident on the material 10 is transmitted to the photodiodes 11 and 12, while only a fraction of the incident light in the range 500-700 nm is transmitted to the photodiodes 11 and 12. The greater the amount of radiation to which the single-use element 300 has been exposed, the greater is the fraction of transmitted light in the range 500-700 nm.

The photodiodes 11 and 12 may be sensitive to different regions in the electromagnetic spectrum, specifically the first photodiode 11 may be sensitive within the range where the absorbance of the material 10 is gradually changed by irradiation, i.e. 500-700 nm, and the second photodiode 12 may be sensitive within the range where the material 10 shows no change or a very limited absorption change because of irradiation, i.e. below 500 nm down to about 440 nm.

A photodiode converts incident light into an electrical current, hence the first photodiode 11 will produce an amount of current proportional to the amount of light that is transmitted and not absorbed. Therefore, the difference in the values of electrical current produced by the photodiode 11 provides information on the absorbance and, consequently, on the radiation dose that has affected the absorbance.

The advantage of using two diodes 11, 12 is the following. Since the amount of transmitted light transmitted through the absorbing material 10 is related to the radiation dose, it is desirable that the current generated by the photodiode is only affected by how much light is transmitted and not by the intensity of the light. In order to remove the effect of the intensity of the light on determining the amount of generated current, a second photodiode 12 may be used. Both the first photodiode 11 and the second photodiode 12 receive light substantially with the same intensity, although in different ranges of the spectrum. Therefore, when using the comparator 14 to compare a first current signal generated by the first photodiode 11 and a second current signal generated by the second photodiode 12, the difference between the first and second current signal does not depend on the intensity of the light, which is a common factor. Rather, the difference depends only on the amount of transmitted light incident on the first photodiode 11, which determines the amount of generated current.

The comparator is connected to the RFID IC 40. Thus, the output current from the comparator 14, or third current, provides power to the electronic circuit, which is in addition to the power provided by the interrogating signal. This additional power is a function of the radiation dose. The impedance of the RFID IC 40 depends on the power it receives and the modified impedance of the RFID IC 40 affects the modulated signal that is then transmitted by the antenna 50.

FIG. 2(b) shows a communication device 200 in which the sensing element 100 comprises a variable capacitor 20.

The communication device 200 may comprise the RFID device 150, which includes an RFID IC 40 and an antenna 50, and coupling means for operationally coupling the RFID IC 40 to the variable capacitor 20. The coupling means may comprise wiring and electrical components such as a resistor 21 and an inductor 22 to form an RLC circuit. The change in the capacitance of the variable capacitor 20 affects the impedance of the RLC circuit, the resonance frequency, the bandwidth or the Q-factor thereof. Since the RLC circuit 20 is connected to the RFID IC 40, these features of the RLC circuit contribute to the response of the communication device 200 to an RFID reader.

In particular, the original impedance of the RFID IC 40 is modified by the coupling with the RLC circuit and this modification is dependent on the change in the capacitance of the variable element, which is determined by e.g. radiation dose. The modified impedance of the structure including the RFID IC 40 and the RLC circuit affects the modulated signal. Specifically, the modified impedance changes the interaction between the phase modulation and the amplitude modulation in the response signal of the communication device 200 to an RFID reader.

FIG. 3 shows two examples of a single-use sterilizable element 300 comprising a sensing element 100 to which an RFID device 150 is connected.

A sensing element 100 as discussed with reference to the previous figures is suitable to be used in combination with a single-use sterilizable element 300 because it is not damaged by the sterilization process. Therefore, a single-use element 300 can be equipped with the sensing element 100 during or right after production, so that the sensing element 100 can monitor the state of the single-use element 300 as it undergoes e.g. sterilization or while it is transported and/or stored. In other words, the sensing element 100 monitors the state of the single-use element 300 until it reaches a user, who may be the end user that utilizes the single-use element 300 or a person in charge of quality and security checks. The user couples the RFID device 150, as discussed above, to the sensing element 100 to form the communication device 200, which enables the user to obtain information about the single-use element 300 from the sensing device 100.

Single-use elements may be used, as explained, for critical fluid handling applications in the biopharmaceutical and biomanufacturing industries. The use of a disposable container may include but is not limited to storage and product hold, mixing and/or cell cultivation. The single-use element 300 may be a sterilizable plastic disposable container that is adapted to contain or hold at least one fluid, such as a bioreactor bag, a mixing container, a 2D or a 3D bioprocessing bag.

FIG. 3(a) shows an example in which the single-use element 300 is a flexible-walled bioreactor bag such as a Biostat® Cultibag® Stirred Tank Reactor (STR) bioreactor bag, a Wave® type Cultibag® RM rocking bioreactor bag, a shaking ORB® type bioreactor bag commercially available from Sartorius Stedim Biotech GmbH and suitably provided with one or more sensing elements 100.

A bioreactor bag may have a wall formed of ethyl vinyl acetate (EVA), which shows an excellent biocompatibility and tubings in platinum-cured silicone for feed, inoculation, base addition, harvest and sampling. The bioreactor bag may comprise an interior mixing element, which may be located in the middle of the bag while being held by a stiff element such as a rod. At one portion of the bag wall, in the example shown in FIG. 3(a) at a portion located at the bottom of the bag, a connection portion to an external drive system may be arranged. The interior mixing element may be coupled and/or connected to the connection portion via the stiff element. The connection between the interior mixing element and the stiff element allows a movement of the two elements relative to each other. The bioreactor bag may further comprise a reclosable opening by which the contents may be introduced into the container. Depending upon the field of use, flexible bioreactor bags can have different sizes, wherein larger containers can have volumes of hundreds of liters. Such a bioreactor may be gamma-sterilized with a dose of about 25 kGy.

FIG. 3(b) shows an example in which the single-use element 300 is a single-use 2D bioprocessing bag (front view), such as a FlexBoy®, Celsius®, or other 2D Bioprocessing bag types commercially available from Sartorius Stedim Biotech GmbH and suitably provided with one or more sensing elements 100.

Such bags are ideal for preparation, storage and transportation of biopharmaceuticals, intermediates and final bulk products. A single-use 2D bioprocessing bag may have walls formed of ethyl vinyl acetate (EVA), which shows an excellent biocompatibility, and may be provided with thermoplastic elastomer tubing. Single-use 2D bioprocessing bags are available in a range of about 5 ml to about 50 l.

LIST OF REFERENCE NUMBERS 10 sensing material with changing absorption characteristics
11 first photodiode
12 second photodiode
13 LED
14 comparator
20 variable capacitor 21 resistor
22 inductor
30 variable resistors
40 electronic circuit
50 antenna
100 sensing element
150 RFID device
200 communication device
300 single-use element

The invention claimed is:

1. A communication device comprising:
a sensing element for monitoring a state of a single-use sterilizable element, wherein the state of the single-use sterilizable element is determined by at least one environmental condition, the sensing element comprising a variable component having at least one physical property that is configured to change in response to the at least one environmental condition and/or a change thereof, wherein the variable component comprises a sensing material with changing absorption characteristics for electromagnetic radiation configured to change in response to the at least one environmental condition and/or the change thereof;
an electronic circuit;
an antenna connected to the electronic circuit, the antenna being configured to transmit a radio-frequency signal modulated by the electronic circuit;
coupling means configured to operatively couple the electronic circuit to the sensing element;
wherein:
the electronic circuit is operatively coupled to the sensing element so that the at least one physical property affects a modulation of the modulated radio-frequency signal,
the coupling means comprises a LED, a first photodiode, wiring and electrical components,
the LED and the first photodiode are disposed such that the sensing material is between the LED and the first photodiode, and
the LED is configured to emit light towards the sensing material to be transmitted by the sensing material, such that the light that is transmitted by the sensing material is incident on the first photodiode.

2. The communication device according to claim 1, wherein the sensing material has changing absorption characteristics for electromagnetic radiation in a first range of wavelength, and the sensing material has substantially fixed absorption characteristics for electromagnetic radiation in a second range of wavelength.

3. The communication device according to claim 2, wherein the sensing material is substantially non-absorbent in the second range of wavelength.

4. The communication device according to claim 1, wherein the sensing material has first changing absorption characteristics for electromagnetic radiation in a first range of wavelength and second changing absorption characteristics for electromagnetic radiation in a second range of wavelength being different from the first range of wavelength.

5. The communication device according to 1, wherein the at least one physical property is configured to change gradually and irreversibly.

6. The communication device of claim 1, further comprising a second photodiode and a comparator, wherein:
the first photodiode is sensitive to a first range of wavelength and the second photodiode is sensitive to a second range of wavelength,
the second photodiode is disposed such that the sensing material is between the LED and the second photodiode,
the LED is configured to emit light towards the sensing material such that the light that is transmitted by the sensing material is incident on the second photodiode, and
the comparator is configured to compare a first current generated by the first photodiode in response to the light incident on the first photodiode to a second current generated by the second photodiode in response to the light incident on the second photodiode and to output a third current proportional to a difference between the first current and the second current.

7. A method for determining a state of a single-use sterilizable element comprising a sensing element, wherein the state of the single-use sterilizable element is determined by at least one environmental condition and the sensing element comprises a variable component having at least one physical property that is configured to change in response to the at least one environmental condition and/or a change thereof, wherein the variable component comprises a sensing material with changing absorption characteristics for electromagnetic radiation configured to change in response to the at least one environmental condition and/or the change thereof, the method comprising:
providing an electronic circuit and an antenna connected to the electronic circuit that transmits a radio-frequency signal modulated by the electronic circuit;
operatively coupling the electronic circuit to the sensing element so that the at least one physical property affects a modulation of the modulated radio-frequency signal; and
sending an interrogating signal to the antenna to prompt the antenna to transmit the modulated radio-frequency signal based on the affected modulation,
wherein operatively coupling the electronic circuit to the sensing element comprises connecting coupling means to the electronic circuit, and
wherein:
the coupling means comprise a LED, a first photodiode, wiring and electrical components,
the LED and the first photodiode are disposed such that the sensing material is between the LED and the first photodiode, and
the LED is configured to emit light towards the sensing material to be transmitted by the sensing material, such that the light that is transmitted by the sensing material is incident on the first photodiode.

* * * * *